(12) United States Patent
Voisin

(10) Patent No.: US 7,037,639 B2
(45) Date of Patent: May 2, 2006

(54) METHODS OF MANUFACTURING A LITHOGRAPHY TEMPLATE

(75) Inventor: Ronald D. Voisin, Fremont, CA (US)

(73) Assignee: Molecular Imprints, Inc., Austin, TX (US)

( * ) Notice: Subject to any disclaimer, the term of this patent is extended or adjusted under 35 U.S.C. 154(b) by 97 days.

(21) Appl. No.: 10/136,188

(22) Filed: May 1, 2002

(65) Prior Publication Data

US 2003/0205657 A1 Nov. 6, 2003

(51) Int. Cl.
*G03F 7/00* (2006.01)

(52) U.S. Cl. .................................. 430/316; 430/313
(58) Field of Classification Search ................ 430/311, 430/313, 316, 322, 323
See application file for complete search history.

(56) References Cited

U.S. PATENT DOCUMENTS

| | | | |
|---|---|---|---|
| 3,783,520 A | 1/1974 | King | |
| 4,070,116 A | 1/1978 | Frosch et al. | |
| 4,119,688 A | 10/1978 | Hiraoka | |
| 4,201,800 A | 5/1980 | Alcorn et al. | |
| 4,426,247 A | 1/1984 | Tamamura et al. | |
| 4,507,331 A | 3/1985 | Hiraoka | |
| 4,512,848 A | 4/1985 | Deckman et al. | |
| 4,552,833 A | 11/1985 | Ito et al. | |
| 4,600,309 A | 7/1986 | Fay | |
| 4,657,845 A | 4/1987 | Frechet et al. | |
| 4,692,205 A | 9/1987 | Sachdev et al. | |
| 4,707,218 A | 11/1987 | Giammarco et al. | |
| 4,722,878 A | * 2/1988 | Watakabe et al. ............ 430/5 |
| 4,724,222 A | 2/1988 | Feldman | |
| 4,731,155 A | 3/1988 | Napoli et al. | |
| 4,737,425 A | 4/1988 | Lin et al. | |
| 4,808,511 A | 2/1989 | Holmes | |
| 4,826,943 A | 5/1989 | Ito et al. | |
| 4,848,911 A | 7/1989 | Uchida et al. | |
| 4,857,477 A | 8/1989 | Kanamori | |
| 4,891,303 A | 1/1990 | Garza et al. | |
| 4,908,298 A | 3/1990 | Hefferon et al. | |
| 4,919,748 A | 4/1990 | Bredbenner et al. | |
| 4,931,351 A | 6/1990 | McColgin et al. | |
| 4,964,945 A | 10/1990 | Calhoun | |
| 4,976,818 A | 12/1990 | Hashimoto et al. | |
| 4,980,316 A | 12/1990 | Huebner | |
| 4,999,280 A | 3/1991 | Hiraoka | |
| 5,028,366 A | 7/1991 | Harakal et al. | |
| 5,053,318 A | 10/1991 | Gulla et al. | |
| 5,071,694 A | 12/1991 | Uekita et al. | |
| 5,074,667 A | 12/1991 | Miyatake | |
| 5,108,875 A | 4/1992 | Thackeray et al. | |
| 5,148,036 A | 9/1992 | Matsugu et al. | |
| 5,148,037 A | 9/1992 | Suda et al. | |
| 5,151,754 A | 9/1992 | Ishibashi et al. | |

(Continued)

FOREIGN PATENT DOCUMENTS

| DE | 2800476 | 7/1978 |
|---|---|---|
| JP | 57-7931 | 6/1980 |

(Continued)

OTHER PUBLICATIONS

Xia et al., "Soft Lithography", Agnew. Chem. Int. Ed., 1998, pp. 550–575, vol. 37.

(Continued)

*Primary Examiner*—Kathleen Duda
(74) *Attorney, Agent, or Firm*—Michael D. Carter

(57) ABSTRACT

A method for forming imprint lithography templates is described herein. The method includes forming a masking layer and a conductive layer on a substrate surface. The use of a conductive layer allows patterning of the masking layer using electron beam pattern generators. The substrate is etched using the patterned masking layer to produce a template.

22 Claims, 8 Drawing Sheets

U.S. PATENT DOCUMENTS

| | | |
|---|---|---|
| 5,169,494 A | 12/1992 | Hashimoto et al. |
| 5,173,393 A | 12/1992 | Sezi et al. |
| 5,179,863 A | 1/1993 | Uchida et al. |
| 5,198,326 A | 3/1993 | Hashimoto et al. |
| 5,212,147 A | 5/1993 | Sheats |
| 5,234,793 A | 8/1993 | Sebald et al. |
| 5,240,878 A | 8/1993 | Fitzsimmons et al. |
| 5,242,711 A | 9/1993 | DeNatale et al. |
| 5,244,818 A | 9/1993 | Jokerst et al. |
| 5,314,772 A | 5/1994 | Kozicki et al. |
| 5,318,870 A | 6/1994 | Hartney |
| 5,324,683 A | 6/1994 | Fitch et al. |
| 5,328,810 A | 7/1994 | Lowrey et al. |
| 5,330,881 A | 7/1994 | Sidman et al. |
| 5,362,606 A | 11/1994 | Hartney et al. |
| 5,366,851 A | 11/1994 | Novembre |
| 5,374,454 A | 12/1994 | Bickford et al. |
| 5,376,810 A | 12/1994 | Hoenk et al. |
| 5,380,474 A | 1/1995 | Rye et al. |
| 5,417,802 A | 5/1995 | Obeng |
| 5,421,981 A | 6/1995 | Leader et al. |
| 5,422,295 A | 6/1995 | Choi et al. |
| 5,424,549 A | 6/1995 | Feldman |
| 5,425,848 A | 6/1995 | Haisma et al. |
| 5,431,777 A | 7/1995 | Austin et al. |
| 5,439,766 A | 8/1995 | Day et al. |
| 5,453,157 A | 9/1995 | Jeng |
| 5,458,520 A | 10/1995 | DeMercurio et al. |
| 5,468,542 A | 11/1995 | Crouch |
| 5,512,131 A | 4/1996 | Kumar et al. ............ 156/655.1 |
| 5,527,662 A | 6/1996 | Hashimoto et al. |
| 5,563,702 A | 10/1996 | Emery et al. |
| 5,601,641 A | 2/1997 | Stephens |
| 5,625,193 A | 4/1997 | Broude et al. |
| 5,654,238 A | 8/1997 | Cronin et al. |
| 5,669,303 A | 9/1997 | Maracas et al. |
| 5,670,415 A | 9/1997 | Rust |
| 5,700,626 A | 12/1997 | Lee et al. |
| 5,736,424 A | 4/1998 | Prybyla et al. |
| 5,743,998 A | 4/1998 | Park |
| 5,772,905 A | 6/1998 | Chou ........................ 216/44 |
| 5,849,209 A | 12/1998 | Kindt-Larsen et al. |
| 5,849,222 A | 12/1998 | Jen et al. |
| 5,855,686 A | 1/1999 | Rust |
| 5,895,263 A | 4/1999 | Carter et al. |
| 5,900,160 A | 5/1999 | Whitesides et al. |
| 5,907,782 A | 5/1999 | Wu |
| 5,921,778 A | 7/1999 | Karmaker et al. |
| 5,926,690 A | 7/1999 | Toprac et al. |
| 5,948,219 A | 9/1999 | Rohner |
| 5,948,470 A | 9/1999 | Harrison et al. |
| 5,948,570 A | 9/1999 | Kornblit et al. |
| 5,952,127 A | 9/1999 | Yamanaka ................... 430/5 |
| 6,033,977 A | 3/2000 | Gutsche et al. |
| 6,035,805 A | 3/2000 | Rust |
| 6,039,897 A | 3/2000 | Lochhead et al. |
| 6,051,345 A | 4/2000 | Huang ........................ 430/5 |
| 6,096,655 A | 8/2000 | Lee et al. |
| 6,133,576 A | 10/2000 | Shafer et al. |
| 6,150,231 A | 11/2000 | Muller et al. |
| 6,150,680 A | 11/2000 | Eastman et al. |
| 6,245,213 B1 | 6/2001 | Olsson et al. ................ 205/646 |
| 6,245,581 B1 | 6/2001 | Bonser et al. |
| 6,274,294 B1 | 8/2001 | Hines |
| 6,309,580 B1 | 10/2001 | Chou |
| 6,326,627 B1 | 12/2001 | Putvinski et al. |
| 6,329,256 B1 | 12/2001 | Ibok |
| 6,334,960 B1 | 1/2002 | Willson et al. ............... 216/52 |
| 6,383,928 B1 | 5/2002 | Eissa |
| 6,387,783 B1 | 5/2002 | Furukawa et al. |
| 6,387,787 B1 | 5/2002 | Mancini et al. |
| 6,388,253 B1 | 5/2002 | Su |
| 6,391,217 B1 | 5/2002 | Schaffer et al. |
| 6,391,798 B1 | 5/2002 | DeFelice et al. |
| 6,455,411 B1 | 9/2002 | Jiang et al. |
| 6,482,742 B1 | 11/2002 | Chou |
| 6,489,068 B1 | 12/2002 | Kye |
| 6,514,672 B1 | 2/2003 | Young et al. |
| 6,517,977 B1 | 2/2003 | Resnick et al. |
| 6,517,995 B1 | 2/2003 | Jacobson et al. |
| 6,518,168 B1 | 2/2003 | Clem et al. |
| 6,518,189 B1 | 2/2003 | Chou |
| 6,534,418 B1 | 3/2003 | Plat et al. |
| 6,541,360 B1 | 4/2003 | Lyons et al. |
| 6,561,706 B1 | 5/2003 | Singh et al. |
| 6,565,928 B1 | 5/2003 | Sakamoto et al. |
| 6,580,172 B1 | 6/2003 | Mancini et al. |
| 6,632,742 B1 | 10/2003 | Yang et al. |
| 6,635,581 B1 | 10/2003 | Wong |
| 6,646,662 B1 | 11/2003 | Nebashi et al. |
| 6,676,983 B1 | 1/2004 | Fujiyama et al. |
| 6,677,252 B1 | 1/2004 | Marsh |
| 6,696,220 B1 | 2/2004 | Bailey et al. |
| 6,703,190 B1 | 3/2004 | Elian et al. |
| 6,713,238 B1 | 3/2004 | Chou et al. |
| 6,716,754 B1 | 4/2004 | Hofmann |
| 6,716,767 B1 | 4/2004 | Shih et al. |
| 6,730,256 B1 | 5/2004 | Bloomstein et al. |
| 6,737,202 B1 | 5/2004 | Gehoski et al. |
| 6,743,713 B1 | 6/2004 | Mukherjee-Roy et al. |
| 6,770,852 B1 | 8/2004 | Steger |
| 6,776,094 B1 | 8/2004 | Whitesides et al. |
| 6,777,170 B1 | 8/2004 | Bloomstein et al. |
| 6,809,356 B1 | 10/2004 | Chou |
| 6,828,244 B1 | 12/2004 | Chou |
| 2002/0042027 A1 | 4/2002 | Chou et al. |
| 2002/0132482 A1 | 9/2002 | Chou |
| 2002/0135099 A1 | 9/2002 | Robinson et al. |
| 2002/0167117 A1 | 11/2002 | Chou |
| 2002/0175298 A1 * | 11/2002 | Moniwa et al. ........ 250/492.22 |
| 2002/0177319 A1 | 11/2002 | Chou |
| 2003/0034329 A1 | 2/2003 | Chou |
| 2003/0080471 A1 | 5/2003 | Chou |
| 2003/0080472 A1 | 5/2003 | Chou |
| 2003/0081193 A1 | 5/2003 | White et al. |
| 2003/0011368 A1 | 6/2003 | Mancini et al. |
| 2003/0129542 A1 | 7/2003 | Shih et al. |
| 2003/0205657 A1 | 11/2003 | Voisin |
| 2003/0205658 A1 | 11/2003 | Volsin |
| 2003/0215577 A1 | 11/2003 | Wilson et al. |
| 2004/0008334 A1 | 1/2004 | Sreenivasan et al. |
| 2004/0029041 A1 | 2/2004 | Shih et al. |
| 2004/0036201 A1 | 2/2004 | Chou et al. |
| 2004/0046288 A1 | 3/2004 | Chou |
| 2004/0090611 A1 | 5/2004 | Choi et al. |
| 2004/0110856 A1 | 6/2004 | Young et al. |
| 2004/0112861 A1 | 6/2004 | Choi et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0146792 A1 | 7/2004 | Nimmakayala et al. |
| 2004/0156108 A1 | 8/2004 | Chou et al. |
| 2004/0163563 A1 | 8/2004 | Sreenivasen et al. |
| 2004/0168586 A1 | 9/2004 | Baiey et al. |
| 2004/0192041 A1 | 9/2004 | Jeong et al. |
| 2004/0197843 A1 | 10/2004 | Chou et al. |

FOREIGN PATENT DOCUMENTS

| | | |
|---|---|---|
| JP | 55-88322 | 12/1986 |
| JP | 63-138730 | 12/1986 |

| | | |
|---|---|---|
| JP | 1-196749 | 8/1989 |
| WO | WO 99/05724 | 2/1999 |
| WO | WO 00/21669 | 4/2000 |
| WO | WO 00/21689 | 4/2000 |
| WO | WO 01/47003 A2 | 6/2001 |
| WO | WO 01/53889 | 7/2001 |
| WO | WO 01/69317 | 9/2001 |
| WO | WO 01/79592 | 10/2001 |
| WO | WO 01/90816 | 11/2001 |
| WO | WO 02/07199 | 1/2002 |
| WO | WO 03/079416 | 9/2003 |
| WO | WO 03/099536 | 12/2003 |
| WO | WO 2004/013693 | 2/2004 |
| WO | WO 2004/016406 | 2/2004 |
| WO | WO 2004/114016 | 12/2004 |

OTHER PUBLICATIONS

Colburn, et al., "Step and Flash Imprint Lithography: A New Approach to High Approach to High–Resolution Patterning", Proc. of SPIE, 1999, pp. 379–389, vol. 3676.

Ruchhoeft et al., "Patterning Curved Surfaces: Templates Generation by Ion Beam Proximity Lithography and Releif Transfer by Step and Flash Imprint Lithography", Journal of Vacuum Science and Technology, 1999, pp. 2965–2982, vol. 17.

Abstract of Japanese Patent 63–138730.

Abstract of Japanese Patent 55–88332.

Abstract of Japanese Patent 57–7931.

Abstract of Japanese Patent 02–92603.

Translation of Japanese Patent 02–92603.

Abstract of Japanese Patent 02–24848.

Translation of Japanese Patent 02–24848.

Heidari et al., "Nanoprint Lithography at the 6 in. Wafer Scale," Journal of Vacuum Science Technology, Nov./Dec. 2000, pp. 3557–3560, vol. B, No. 18(6).

Nerac. com Retro Search, "Reduction of Dimension of Contract Holes", Aug. 31, 2004.

Nerc.com Retro Search, "Trim Etching of Features Formed on an Organic Layer", Sep. 2, 2004.

Nerc.com Retro Search, "Multi–Layer Resists", Sep. 2, 2004.

Chou, Nanoiprint Lithography and Lithography Induced Self–Assembly, MRS Bulletin, pp. 512–517, Jul. 1, 2001.

Colburn et al., Step and Flash Imprint Lithography for sub–100 nm Patterning, Proceedings of SPIE vol. 3997, pp. 453–457, Jan. 1, 2000.

Johnson et al., Advances in Step and Flash Imprint Lithography, SPIE Micrography Conference, Feb. 23, 2003.

Chou et al., Ultrafast and Direct Inprint of Nanostrctures in Silicon, Nature, Col. 417, (Jun. 2002), pp. 835–837, Jan. 01, 2002.

Chou et al., Nanoprint Lithography, Journal of Vacuum Science Technology B 14(16), pp. 4129–4133, Nov. 1, 1996.

Coburn et al., Development and Advantages of Step–and––Flash Lithogrpahy, Solid State Technology, Jul. 1, 2001.

Resnick et al., High Resolution Templates for Step and Flash Imprint Lithography, Journal of Microlithography, Microfabrication, and Microsystem. vol. 1, No. 3., Oct. 1, 2002.

Colburn et al., Characterization and Modeling of Volumetric and Mechanical Proerties for Step and Flash Imprint Lithography Photopolymers, Journal of Vacuum Science Technology, vol. b. 19(6), Nov. 1, 2001.

Bailey et al., Step and Flash Imprint Lithography: Template Surface Treatment and Defect Analysis, Journal of Vacuum Science, B 18(6), pp. 3572–3577, Nov. 1, 2000.

Schneider et al., Stripes of Partially Fluorinated Alkyl Chains: Dipolar Langmuir Monolayers.

Bailey et al., Step and Flash Imprint Lithography: Defect Analysis, Journal of Vacuum Science, B 19(6), pp. 2806–2810, Nov. 1, 2001.

Choi et al., "Design of Orientation Stages for Step and Flash Imprint Lithography," Precision Engineering pp. 192–199, Jan. 1, 2001.

Mirkin et al., "Emerging Methods for Micro–and Nanofabrication," MRS Bulletin, pp. 506–509, Jul. 1, 2001.

Chou et al., "Imprint Lithography with Sub–10 nm Feature Size and High Throughout," Microelectronic Engineering 35, pp. 237–240, Jan. 1, 1997.

Haisma et al., "Mold–assisted Nanolithography: A Process for Reliable Pattern Replication," J. Vac. Sci. Technol. B, pp. 4124–4128, Nov. 1, 1996.

Scheer et al., "Problems of the Nanoinprinting Technique for Nanometer Scale Pattern Definition," J. Vac. Sci. Technol. B, pp. 3917–3921, Nov. 1, 1998.

Feldman, "Wafer Chuck for Magnification Correction in X–ray Lithography,"J. Vac. Sci. Technol. B 16(6), pp. 3476–3479, Nov. 1, 1998.

Xia et al., "Soft Lithography,"Annu Rev. Mater Sci. 1998 28: 153–184, Nov. 1, 1998.

Chou et al., "Imprint of Sub–25 nm Vias and Trenches in Polymers," Appl. Phys. Lett. 67 (21), Nov. 20, 1995.

Krug et al., "Fine Patterning of Thin Sol–gel Films," Journal of Non–Crystalline Solids 147 & 148, pp. 447–450, Jan. 1, 1992.

Krauss et al., "Fabrication of Nanodevices Using Sub–25 nm Imprint Lithography," Appl. Phys. Lett. 67(21), pp. 3114–3116, Jan. 1, 1995.

Chou et al., "Imprint Lithography with 25–Nanometer Resolution," Science vol. 272, pp. 85–87, Apr. 5, 1996.

Abstract of Japanese Patent 63–138730.

Hu et al., "Flourscence Probe Techniques (FPT) for Measuring the Relative Effciencies of Free–Radical Photoinitiators", s0024–9297(97)01390–9;"Macromolecules" 1998, vol. 31, No. 13, pp. 4107–4113, 1998 American Chemical Society. Published on Web May 29, 1998.

Feynman, Richard P., "There's Plenty of Room at the Bottom—An Invitation to Enter a New Field of Physics," 12 pp. online Retreived Sep. 23, 2004 from URI:http://www-.zyvex.com/nanotech/feynman.html.

Ciba Specialty Chemicals Business Line Coatings, "What is UV Curing?", 45 pp. online Retreived Apr. 24, 2004 from URL:http//www.cibasc.com/image.asp?id=4040.

Communication Relating to the Results of the Partial International Search; International Appl. No. PCT/US200/015551.

Papirer et al., "The Grafting of Perflourinated Silanes onto the Surface of Silica: Characterization by Inverse Gas Chromatography," Aug. 1993, pp. 238–242, vol. 159, Issue 1.

Abstract of Papirer et al., "The Grafting of Perflourinated Silanes onto the Surface of Silica: Characterization by Inverse Gas Chromatography," Aug. 1993, pp. 1993, pp. 238–242, vol. 159, Issue 1.

Hirai et al., "Mold Surface Treatment for Imprint Lithography," Aug. 2001, pp. 457–462, vol. 14, No. 3.

Abstract of Hirai et al., "Mold Surface Treatment for Imprint Lithpgraphy," Aug. 2001, pp. 457–462, vol. 14, No. 3.

Sung et al., "Micro/nano–tribological Characteristics of Self–Assembled Monoloayer and its Application in Nano–Structure Fabrication," Jul. 2003, pp. 808–818, vol. 255, No. 7.

Abstract of Sung et al., "Micro/nano–tribological Characteristics of Self–Assembled Monoloayer and its Application in Nano–Structure Fabrication," Jul. 2003, pp. 808–818, vol. 255, No. 7.

Roos et al., "Nanoprint Lithography with a Commerical 4 inch Bond System for Hot Embossing," Oct. 2001, pp. 427–435, vol. 4343.

Abstract of Roos et al., "Nanoimprint Lithpgraphy with a Commerical 4 inch Bond System for Hot Embossing," Oct. 2001, pp. 427–435, vol. 4343.

* cited by examiner

METHODS OF MANUFACTURING A LITHOGRAPHY TEMPLATE

BACKGROUND OF THE INVENTION

1. Field of the Invention

This present invention generally relates to lithography templates. More particularly, certain embodiments of the invention relate to the formation of imprint lithography templates fabricated by pattern generators.

2. Description of the Relevant Art

For imprint lithography, a relief pattern in a template is used, in conjunction with monomers/polymers to imprint a desired pattern into monomers/polymers on the surface of a substrate (e.g., semiconductors, dielectric materials, magnetic or optoelectronic materials.) The processes commonly used to manufacture projection photomasks are often applied to the manufacture of templates for imprint lithography. For this reason, it is useful to provide background of the manufacture of optical projection lithography and optical projection photomasks.

A conventional projection photolithography system projects a UV light pattern onto a light sensitive coating (e.g., a photoresist) to expose selected portions of the light sensitive coating. The light sensitive coating is developed to create a mask for a fabrication process such as etching or doping of the underlying substrate. The photolithography systems commonly employ a photomask or reticle that controls which portions of the light sensitive coating are illuminated. For integrated circuit manufacturing, the photomask has a precise pattern that the projection transfers, with or without demagnification, to the integrated circuit device.

Photomask making begins with an optically transparent substrate (e.g., quartz). One side of the transparent substrate is typically coated with an optically opaque film of a material (e.g., chromium). A resist material (e.g., a polymer) layer is then applied to the opaque film, and a pattern generation process exposes the photoresist layer to light or electron bombardment. Various types of pattern generation equipment are known. For example, scanning systems may be programmed with a digitized image or pixel pattern that corresponds to the desired pattern to be exposed on the photoresist layer. The scanning system exposes only the photoresist areas that correspond to the pixels having values indicating that the areas should be exposed.

Developing of the photoresist layer creates a photoresist pattern with openings that expose the underlying opaque layer. The photoresist pattern and openings have a critical or minimum feature size that depends on the pattern generation equipment used to expose the photoresist layer. An etching process, typically an anisotropic etch, using the photoresist pattern as an etching mask removes portions of the opaque layer to create an opaque pattern having openings. Etching of the opaque material may be difficult if the opaque material is a metal. Many metals produce particles and aggregates during a dry etch process which may be deposited on the substrate creating defects in the pattern. A wet etch process may be used to avoid the deposition of particles, however, wet etching processes suffer from undercutting problems for very small features. Following the etch, the photoresist pattern is stripped from the substrate, leaving a hard photomask that includes a discontinuous opaque pattern on the substrate. The photomask is then measured, inspected and repaired if necessary. The opaque pattern provides a high contrast binary image for the projection of the photomask in a photolithography system. Alternatively, the opaque layer may be removed to form a set of openings in the underlying transparent substrate. Such a process is users to create a "phase mask." The depth of the openings formed on the transparent substrate are chosen to maximize the phase contrast at the exposure wavelength. Typically, a phase mask is inspected at the exposure wavelength to obtain the maximum contrast.

A problem with trying to apply photomask manufacturing process for the manufacture of imprint lithography templates is that the completed photomask tends to have a critical feature size that is generally larger than the feature size that the pattern generation equipment can create. In particular, the etching process using the photoresist pattern as etch mask is often a wet chemistry etch (or isotropic) process. An isotropic, wet chemistry etch process has historically been desirable because a wet etch process is inexpensive and relatively defect free. However, the isotropic etching undercuts the photoresist pattern by about the thickness of the opaque layer or more and makes the openings in the opaque pattern larger than the original openings in photoresist pattern. For previous generations of semiconductor devices, the undercutting, while not desirable, was acceptable. However, as feature sizes become smaller, the size of the undercut becomes more difficult to accommodate, and higher resolution generations of integrated circuits having smaller feature sizes have found the undercutting unacceptable.

To overcome this difficulty, the use of anisotropic etch of the opaque material has been explored. Heavy metal compounds that are liberated during the dry etch processes, however, inherently accrete and precipitate to create defects on the photomask surface. Additionally there tends to be relatively poor etch selectivity (between the photoresist pattern and the opaque layer) that results in some undercut because the dry etch widens the openings. Despite these difficulties, dry etching processes for the creation of high resolution photomasks are generally preferred despite the additional costs of defect repair and lower yields.

One method to avoid heavy metals, is to coat the photoresist directly onto the substrate and then to coat the photoresist with a conductive top coat (e.g., Aquatar). The conductive top coat will bleed a charge to facilitate high resolution e-beam patterning of the photoresist. The photoresist will act as the etch mask for etching a relief pattern into the quartz substrate with anisotropic, high selectivity etching and substantially no undercut.

Another method to eliminate heavy metals and still remove charge during e-beam patterning was reported by D. J. Resnick at the SPIE's 27h Annual International Symposium and Education Program on Microlithography, Mar. 3–8, 2002 in Santa Clara, Calif. By incorporating a permanent conductive layer of indium tin oxide on a substrate, charge bleeding is facilitated, not only during pattern generation, but also at subsequent inspections which may also use electron beams. However, this technique has drawbacks. The indium tin oxide layer, while transparent at visible wavelengths, is generally opaque at deep ultraviolet wavelengths thereby limiting the use of deep ultraviolet wavelengths in imprint lithography that would use such templates.

Imprint lithography templates also tend to have a much higher aspect ratio than photomasks. Thus, the depth of an imprint lithography template is typically greater than a depth of a photomask. The greater depth of the recesses in an imprint lithography template may make inspection difficult.

SUMMARY OF THE INVENTION

Described herein are methods for making templates for use in lithography systems. The methods described herein are directed to the production of templates with minimal undercut, low defect density, and improved inspectability. These methods are particularly useful for the formation of templates having features that have a lateral feature size of less than about 200 nm. For ultraviolet light curing applications, a template may be formed from an ultraviolet light transmissive substrate. The ultraviolet light transmissive substrate may be formed from a variety of materials (e.g., quartz). Initially, a conductive polysilicon layer is formed on the surface of the substrate. Upon the conductive polysilicon layer, a masking layer is formed. Masking layer may be composed of a photoresist material. The masking layer is partially patterned and developed. During the development process portions of the masking layer are removed to reveal portions of the underlying conductive polysilicon layer. The masking layer may be patterned using a pattern generator. Examples of pattern generators include electron beam pattern generators and laser beam pattern generators. The exposed portions of the conductive polysilicon layer may be etched using an anisotropic etch procedure. The etching of the conductive polysilicon layer is continued until portions of the underlying substrate are exposed. The exposed portions of the underlying substrate may be etched using an anisotropic process. Removal of the remaining portions of the conductive polysilicon layer and the masking layer is performed after the etching of the substrate is complete.

The use of a conductive polysilicon masking layer may allow increased contrast during inspection processes. In one embodiment, the thickness of the conductive polysilicon layer may be set to maximize the contrast between the template and the conductive polysilicon layer during a light inspection process. Alternatively the conductive polysilicon layer may have a predetermined thickness based on processing requirements. In this situation, the wavelength of light used for the inspection processed may be altered to maximize the contrast between the template and the conductive polysilicon layer.

In an alternate embodiment, a template may be formed using a conductive layer to aid in etching a masking layer. A masking layer may be disposed on a substrate (e.g., quartz). The masking layer may be composed of a photoresist material. A conductive layer may be disposed on the masking layer. In one embodiment, conductive layer is an aluminum layer. A pattern may be formed in the masking layer by exposing the masking layer to an electron beam pattern generator through the conductive layer and developing the masking layer. The conductive layer is removed and portions of the masking layer are removed to reveal the underlying substrate. The exposed portions of the underlying substrate may be etched using an anisotropic process. Removal of the remaining portions of the conductive polysilicon layer and the masking layer is performed after the etching of the substrate is complete.

In an alternate embodiment, a substrate is formed having a base layer, an etch stop layer and an upper layer, with the etch stop layer disposed between the base layer and the upper layer. The resulting substrate may be etched using either of the techniques described above. Etching of the substrate may be controlled by the etch stop layer. The etch stop layer may be formed of a material that has a substantially different etching rate than the upper layer. Because of this difference in etch rate, the etch stop layer may provide a more uniform depth of etching.

BRIEF DESCRIPTION OF THE DRAWINGS

Other objects and advantages of the invention will become apparent upon reading the following detailed description and upon reference to the accompanying drawings in which.

Figure 1A:
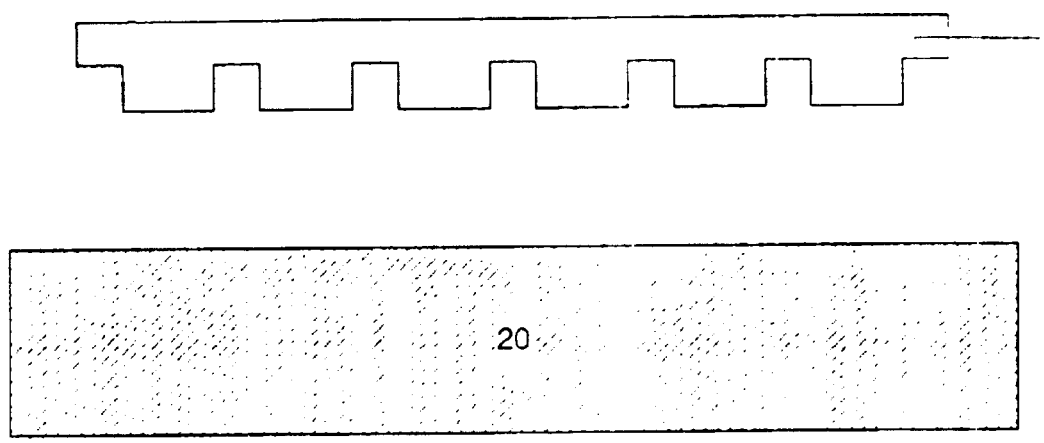
FIGS. 1A–1E depict partial cross-sectional views of a sequence of imprint lithography processing steps.

It should be understood that the cross-sectional representations depicted in the figures are not of the entire template, but a representative portion of the template. Furthermore, it should be understood that the figures are not to scale and features have been exaggerated for illustrative purposes. While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

In general, a method of forming a pattern on a substrate may be accomplished by the use of imprint lithography processes. A typical imprint lithography process includes applying a curable liquid to a substrate, placing a patterned template in contact with the curable liquid, curing the liquid, and removing the template. The pattern of the template is imparted to the cured material disposed on the substrate.

A typical imprint lithography process is shown in FIGS. 1A through 1E. As depicted in FIG. 1A, template 12 is positioned in a spaced relation to the substrate 20 such that a gap is formed between template 12 and substrate 20. Template 12 may include a surface fabricated to take on the shape of desired features, which in turn, may be transferred to the substrate 20. As used herein, a "feature size" generally refers to a width, length and/or depth of one of the desired features. Surface of template 12 may be treated with a thin layer that lowers the template surface energy and assists in separation of template 12 from substrate 20. Devices for controlling the orientation and spacing of template 12 with respect to substrate 20 and methods for performing imprint lithography are discussed in U.S. Pat. No. 6,334,960 and U.S. patent application Ser. Nos. 09/908,455, 09/907,512, 09/920,341, 09/934,248, and 09/976,681 all of which are incorporated herein by reference.

Figure 1B:
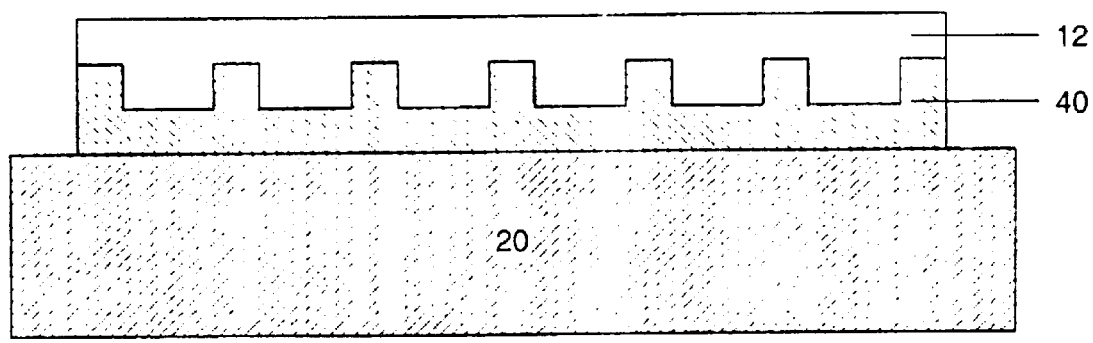
Figure 1C:
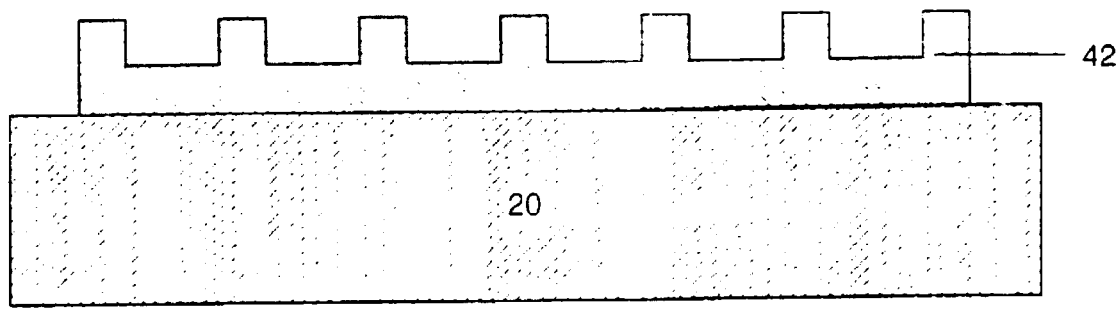

A curable liquid 40 is disposed on the surface of substrate 20. Template 12 is brought into contact with curable liquid 40. Curable liquid 40 generally conforms to the shape of template 12 as depicted in FIG. 1B. The position of template 12 is adjusted to create a desired gap distance between the template and substrate 20. The position of template 12 may also be adjusted to properly align the template with the substrate. After template 12 is properly positioned, curable liquid 40 may be cured to form a masking layer 42 on the substrate. Template 12 may be removed from masking layer 42, leaving the cured masking layer on the surface of substrate 20, as depicted in FIG. 1C. Masking layer 42 has a pattern that is complementary to the pattern of template 12.

Figure 1D:
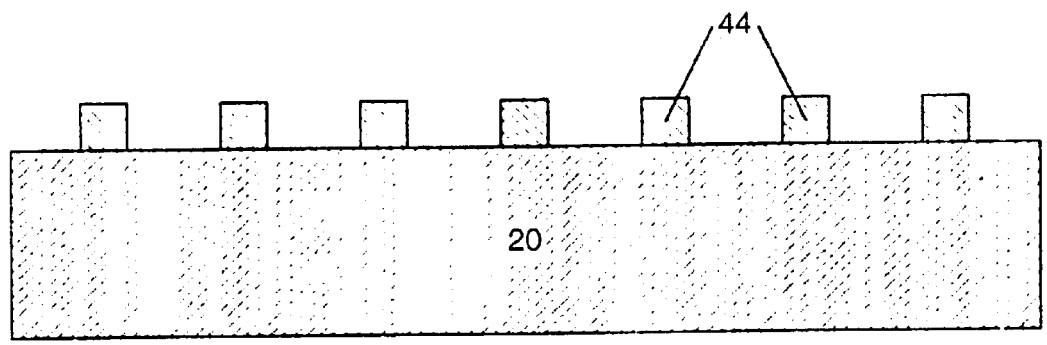
Figure 1E:
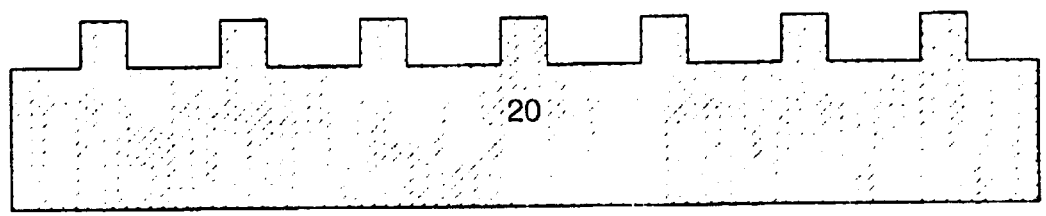

Masking layer 42 is used as a mask for etching substrate 20. Masking layer 42 is etched using an anisotropic process until portions of substrate 20 are exposed through masking layer 42, as depicted in FIG. 1D. Portions 44 of masking layer 42 remain on substrate 20 and are used to inhibit etching of portions of substrate 20. After etching of masking layer 42 is complete, substrate 20 is etched using known etching processes. Portions of substrate 20 disposed under portions 44 of masking layer 42 remain substantially unetched while the exposed portions of substrate 20 are etched. In this manner the pattern of template 12 is transferred to substrate 20. The remaining portions 44 of masking layer 42 may be removed to create a patterned substrate 20, depicted in FIG. 1E.

For imprint lithography techniques, as described above, a relief pattern in a template is used, in conjunction with monomers/polymers to create a desired pattern in a substrate. For integrated circuit manufacturing or other high resolution applications, the template should have a precise pattern that the pressing transfers, inherently with minimal demagnification, to the surface of the integrated circuit device. The processes commonly used to manufacture projection photomasks (for projection photolithography) may be applied to the manufacture of templates for imprint lithography.

For templates, where a relief pattern is pressed into the substrate, there is no requirement for an opaque layer, as is required for photomasks. In fact, some imprint lithography processes use light curable liquids. In such cases it is advantageous for the template to be formed from a light transmissive material. However, since imprinting is inherently a 1× pattern transfer process (i.e., no demagnification), it is desirable to use electron beam pattern generators (PGs) which generally have higher resolution than other pattern generation systems (e.g., laser pattern generators). Electron beam pattern generators strongly benefit from the use of an electrically conductive layer on the mask substrate in order to remove charge from the mask substrate during the pattern generation process. The opaque layers used in the formation of projection photomasks generally serve this additional purpose. For template manufacturing it would be desirable to select a conductive film that would remove charge during processing with an electron beam pattern generator, but one that would also facilitate the relief pattern etch, without the defect and etch selectivity problems associated the opaque heavy metals.

Figure 2A:
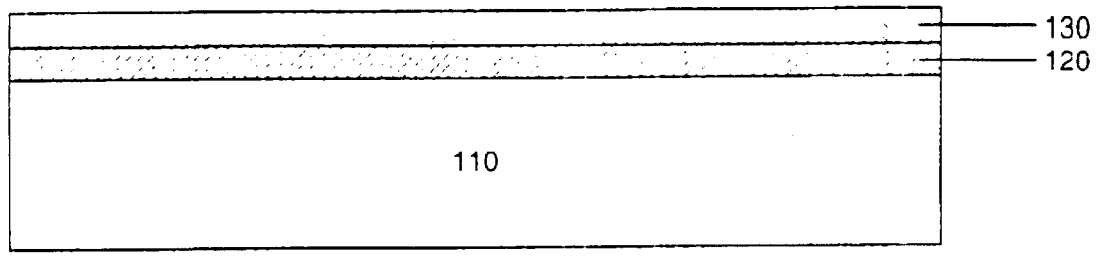
FIGS. 2A–2F depict partial cross-sectional views of a sequence of processing steps for forming an imprint lithography template using a conductive polysilicon layer and a masking layer during etching of a substrate.

Turning to FIGS. 2A–2F, a process for making a template is depicted. FIG. 2A depicts a partial cross-sectional view of an imprint lithography substrate 110 with a conductive polysilicon layer 120 and a masking layer 130 formed upon substrate 110. Substrate 110 may be composed of a variety of materials including, but not limited to, silicon, silicon dioxide, silicon germanium, gallium nitride, silicon germanium carbon, sapphire, gallium arsinide, epitaxial silicon, polysilicon, quartz, indium tin oxide, SiOx (where x is less than 2) or combinations thereof. The curing process for some imprint lithography processes uses activating light (e.g., ultraviolet light) to cure a masking layer (e.g., photoresist). For activating light imprint lithographic processes it is desirable for the template to be substantially transparent to the wavelength of light used to cure a masking layer. Alternatively, the template may be formed from an opaque material if curing may be accomplished through the substrate during the imprint lithography process. In some embodiments, templates are formed from materials that are ultraviolet light transmissive. Examples of such materials include glasses. A glass as used herein is defined as a substantially transparent material that includes silicon dioxide (silica). Glass is typically composed of silicon dioxide, sodium carbonate (soda ash), and calcium oxide (lime). This type of glass is typically referred to as "soda-lime glass." Additives may be added to soda-lime glass to alter properties of the glass. Boric oxide may be added to glass to improve the heat resistant properties of the glass. Soda-lime glass that includes boric acid is typically known as "borosilicate glass." Other materials such as metals (e.g., titanium) and metal oxides (e.g., calcium oxide, lead oxide, lithium oxide, cerium oxide, etc.) may be added to soda-lime glass to alter properties of the glass. Glass enamels may be formed from lead borosilicate. Quartz glass differs from soda-lime glass in that it is composed of crystallized silicon dioxide. Quartz glass has a broad range of ultraviolet light transmissibility. Quartz glass may be preferred for use when deep ultraviolet light wavelengths are required for curing a masking layer on a substrate during an imprint lithography process.

Deposited upon substrate 110 is a conductive polysilicon layer 120. Conductive polysilicon layer 120 may be deposited using a chemical vapor deposition process (e.g., a plasma enhanced chemical vapor deposition ("PECVD") process or a low pressure chemical vapor deposition ("LPCVD") process using a silane source) or a sputtering process. The phrase "conductive polysilicon layer" is also meant to encompass alloys of polysilicon such as silicides. Examples of silicides include, but are not limited to, titanium silicide, tungsten silicide, and cobalt silicide. Conductive polysilicon layer 120 may be deposited to a thickness of approximately 50 to about 200 nm. As described later, the thickness of the polysilicon layer may be selected to maximize the contrast between conductive polysilicon layer 120 and substrate 110 during inspection of the template. The upper surface of conductive polysilicon layer 120 may be polished to substantially reduce its surface roughness. This polishing may be accomplished by mechanical polishing, chemical-mechanical polishing or sacrificial etchback. As a result, the thickness of polysilicon layer 120 may be reduced to a uniform thickness across substrate 110.

Conductive polysilicon layer 120 may be rendered conductive by implanting ions into the polysilicon layer. Examples of ions that may be implanted into the polysilicon include, but are not limited to, p-type dopants such as boron, or n-type dopants, such as phosphorus or arsenic. Ions may be implanted using standard ion implantation devices or using spin-on dopant procedures that transfer ions into an underlying layer. In some embodiments, after ion implantation is completed conductive polysilicon layer 120 may be subjected to an anneal process. The anneal process may alter the distribution of ions in conductive polysilicon layer 120 to make the distribution more homogenous. Alternatively, the deposited polysilicon layer may be rendered conductive by forming converting a portion of the polysilicon layer into a silicide.

In an alternate embodiment, conductive polysilicon layer 120 may be formed by depositing in-situ doped polysilicon on substrate 110. In-situ doped polysilicon is produced by using a combination of silane and a dopant in a chemical vapor deposition process. Examples of dopants include, but are not limited to phosphorus, boron, or arsenic. The use of in-situ doped polysilicon may render the template fabrication process more efficient as the ion implantation step, described above, may be eliminated from the processing scheme.

After formation of conductive polysilicon layer 120, a masking layer 130 is deposited upon the conductive polysilicon layer. Masking layer 130 is formed from a material that may be patterned using a pattern generator system. Pattern beam generators include both laser pattern generators and electron beam pattern generators. In one embodiment, an electron beam pattern generator system is used to create a pattern in masking layer 130. When an electron beam pattern generator is used, masking layer 130 is formed from a photoresist material. Any known photoresist material may be used, including both positive and negative photoresist materials as supplied by Brewer Science Inc., and other commercial suppliers.

Figure 2B:
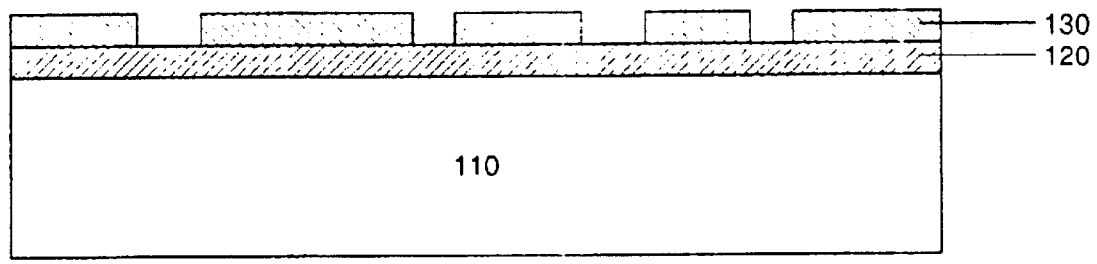

When a photoresist is used as masking layer 130, the photoresist is formed by applying the photoresist material to conductive polysilicon layer 120 using a spin coating process. Masking layer 130 may be exposed to light or electrons using a light or electron beam pattern generator. When an electron beam pattern generator is used, conductive polysilicon layer 120 removes charge build up from masking layer 130 during the patterning process. Conductive polysilicon layer 120 may thus replace the conductive metals that have been used in similar photomask production processes. During an electron beam development process, portions of masking layer 130 are contacted with an electron beam. If a positive photoresist is used, the portions of the photoresist that were exposed to the electron beam (i.e., the "exposed" regions) are removed during a development process. If a negative resist is used, the exposed regions of the photoresist will remain after the development process. For both positive and negative photoresist the development process is a wet etch process. Electron beam pattern generators typically use a digital image of the desired pattern. The digital image is used to drive the electron beam to replicate the digital image on masking layer 130. The use of an electron beam pattern generator allows the formation of sub 100 nm features in the photoresist. FIG. 2B depicts a cross section view of the process after development of masking layer 130.

Figure 2C:
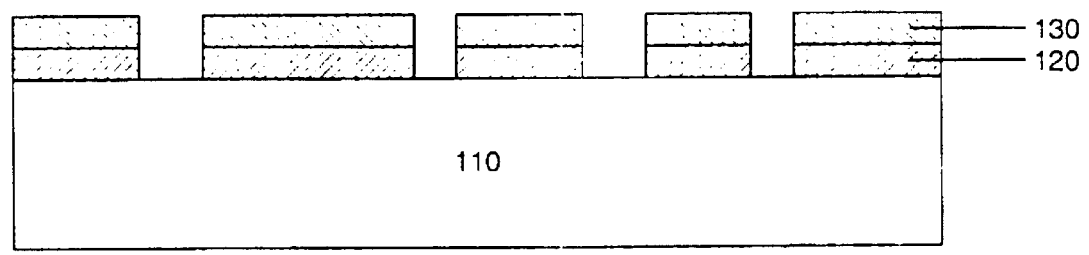

After etching of masking layer 130, the remaining portions of masking layer 130 are used to control etching of conductive polysilicon layer 120. Etching of conductive polysilicon layer 120 is performed using an anisotropic etch (e.g., a plasma etching process or a reactive ion etching process). The term "anisotropic" etch refers to, any process that removes substantially horizontal surfaces faster than substantially vertical surfaces. An anisotropic etch, such as a plasma etch, employs both physical and chemical removal mechanisms. Ions are bombarded at an angle substantially perpendicular to substrate. This causes substantially horizontal surfaces to be removed aster than substantially vertical surfaces. As depicted in FIG. 2C, the remaining portions of masking layer 130 inhibit etching of the underlying portions of conductive polysilicon layer 120. Etching of the exposed portions of conductive polysilicon layer 120 is continued until substrate 110 is reached.

Figure 2D:
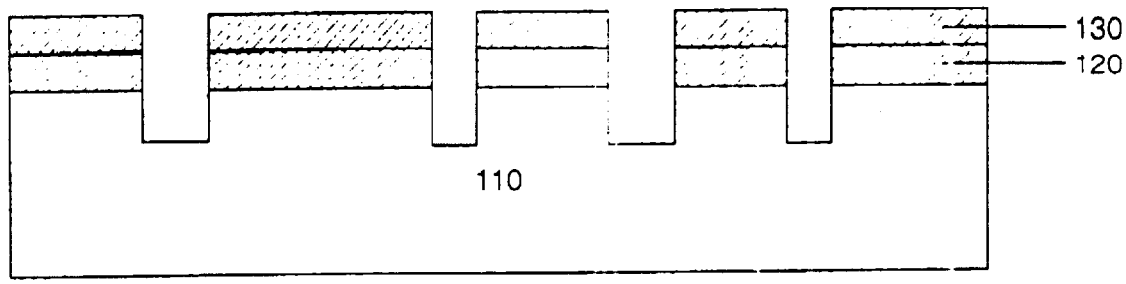

In one embodiment, the remaining portions of masking layer 130 and conductive polysilicon layer 120 may be used in combination to control etching of substrate 110. Etching of substrate 110 is performed using an anisotropic etch (e.g., a plasma etching process or a reactive ion etching process). As depicted in FIG. 2D, the remaining portions of masking layer 130 and conductive polysilicon layer 120 together inhibit etching of the underlying portions of substrate 110. Etching of the exposed portions of substrate 110 is continued until a predetermined depth is reached. An advantage of using a combination of masking layer 130 and conductive polysilicon layer 120 as a mask for etching of substrate 110 is that the combined stack of layers may create a high aspect ratio mask (i.e., a mask that has a greater height than width). A high aspect ratio masking layer may improve the anisotropic etching process by inhibiting undercutting of the masking portions.

Figure 2E:
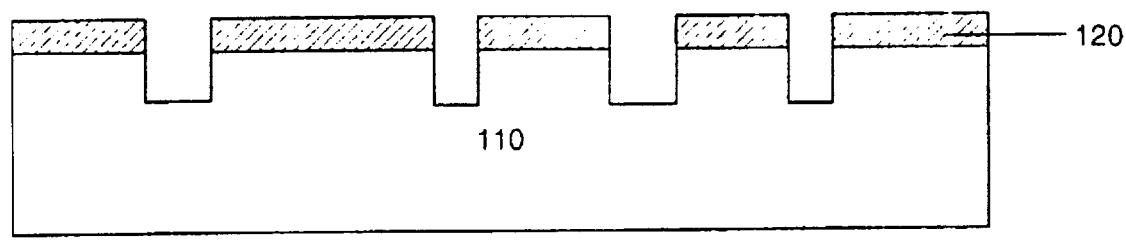
Figure 2F:
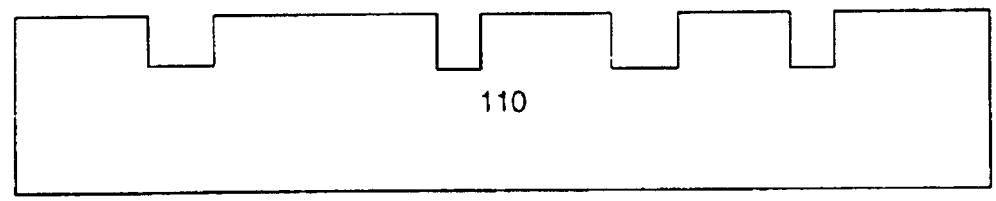

Prior to use in an imprint lithography process the remaining portions of masking layer 130 and conductive polysilicon layer 120 are removed. The remaining portions of masking layer 130 and conductive polysilicon layer 120 may be removed using a dry etch process or a wet etch process. In some embodiments, the layers may be removed sequentially. Masking layer 130 may be removed first, as depicted in FIG. 2E. Portions of conductive polysilicon layer 120 may remain on substrate 110. Prior to removal of conductive polysilicon layer 120, the template may be inspected to verify the accuracy of the etching process. The inspection process may involve the use of an electron beam scanning device (e.g., a scanning electron microscope). Inspection of the template may be performed while portions of conductive polysilicon layer 130 remain on substrate 110. Conductive polysilicon layer 130 allows the charge to be removed from the substrate during the electron beam scanning process.

Inspection may also be performed using a light inspection device (e.g., an ultraviolet light scanning device). Because conductive polysilicon layer 130 has a different index of refraction than substrate 110, the conductive polysilicon layer may have a different appearance during an light inspection process. The contrast between conductive polysilicon layer 130 and substrate 110 may be enhanced by control of the thickness of the conductive polysilicon layer. For example, conductive polysilicon layer 130 may be formed to maximize the reflectance of the inspection light off of the surface of the conductive polysilicon layer. The polysilicon thickness and the depth of the quartz etch combine to determine the phase and attenuation contrast of the inspection process. For instance, by inspecting in the deep ultraviolet light region, the polysilicon is substantially opaque, while the underlying substrate may allow at least partial transmission of the ultraviolet inspection light. Alternatively, maximum contrast for patterned polysilicon on an unpatterned substrate may be achieved by setting the thickness of conductive polysilicon layer 130 to be about ½ of the wavelength of light used for the light inspection 10 process. For example, if deep ultraviolet light having a wavelength of about 200 nm is used for inspection of the template, conductive polysilicon layer 130 may be formed having a thickness of about 100 nm. In this manner, the contrast may be increased between the etch portions of the substrate and the portions of the substrate on which the conductive polysilicon remain. The use of ½ wavelength polysilicon is believed to create an in-phase reflectance off of both surfaces which maximizes reflectance. Inspection using ultraviolet light may be accomplished by inspecting the top surface of the template (i.e., the surface upon which the conductive polysilicon layer is disposed) or through the bottom surface of the template. If inspection of the template is done after the substrate is etched, the thickness of the polysilicon is optimized to maximize the contrast during inspection.

Prior to use of the imprint lithography template, conductive polysilicon layer 120 is removed from substrate 110. Removal of conductive polysilicon layer 130 may be accomplished by use of isotropic etching (e.g., wet etching process) or anisotropic (e.g., dry etching processes).

Figure 3A:
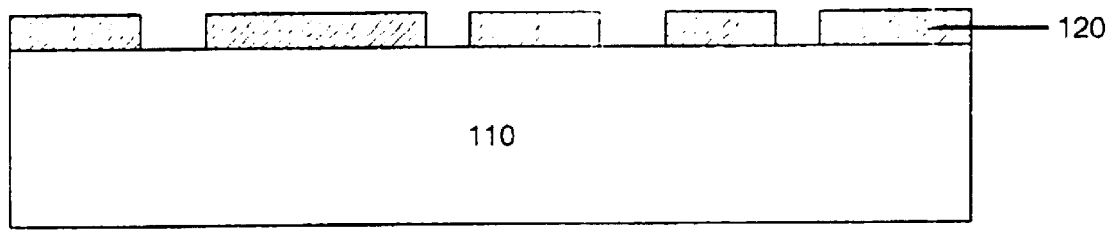
FIGS. 3A–3C depict partial cross-sectional views of a sequence of processing steps for forming an imprint lithography template using a conductive polysilicon layer during etching of a substrate.
Figure 3B:
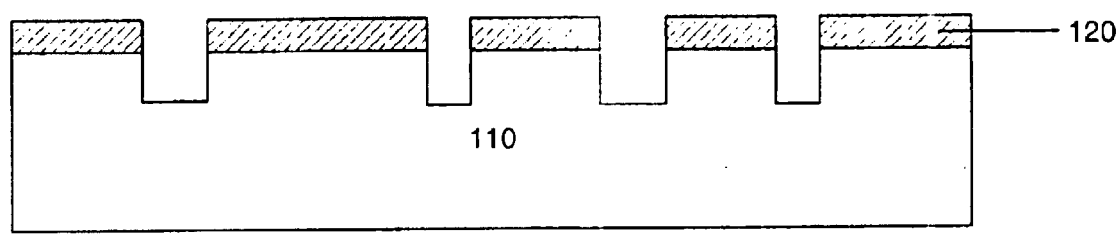
Figure 3C:
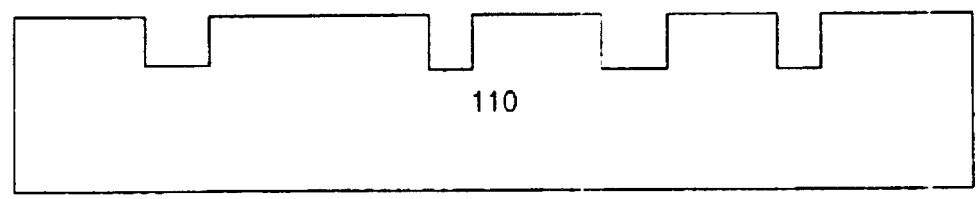

An alternate processing scheme is depicted in FIGS. 3A–3C. The structure depicted in FIG. 3A is produced using the same sequence of steps as depicted in FIGS. 2A–2C, as described above. After conductive polysilicon layer 120 is etched, masking layer 130 is removed prior to etching the substrate, as depicted in FIG. 3A. This offers the advantage of allowing inspection of the patterned conductive polysilicon layer 130 prior to etching of substrate 110. Inspection of conductive polysilicon layer 120 may be performed using a light inspection device (e.g., ultraviolet light) or an electron scanning devices (e.g., a scanning electron microscope). If the pattern imparted to conductive polysilicon layer 120 is not accurate, substrate 110 may be removed from further processing, thus minimizing wasted time and resources.

Patterned conductive polysilicon layer 120 may be used to control etching of substrate 110. Etching of substrate 110 may be performed using an anisotropic etch (e.g., a plasma etching process or a reactive ion etching process). As depicted in FIG. 3B, the remaining portions of conductive polysilicon layer 120 inhibit etching of the underlying portions of substrate 110. Etching of the exposed portions of substrate 110 is continued until a predetermined depth is reached. Prior to use of the imprint lithography template, conductive polysilicon layer 130 is removed from substrate 110. Removal of conductive polysilicon layer 130 may be accomplished by use of isotropic etching (e.g., wet etching process) or anisotropic (e.g., dry etching processes).

Figure 4A:
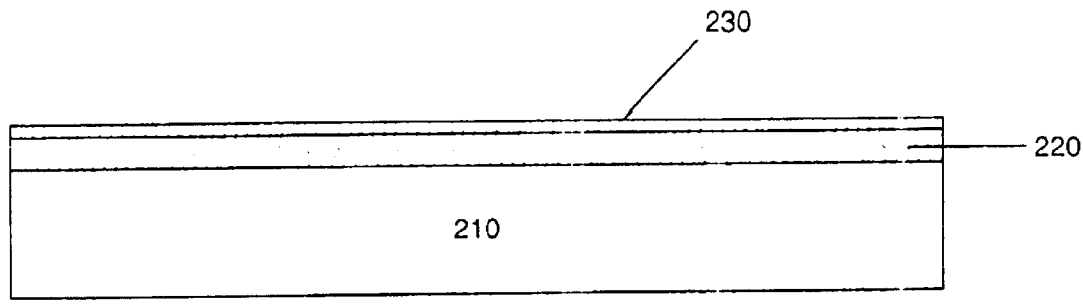
FIGS. 4A–4D depict partial cross-sectional views of a sequence of processing steps for forming an imprint lithography template using a conductive metal layer during etching of a masking layer.

Turning to FIGS. 4A–4D an alternate process for making a template is depicted. FIG. 4A depicts a partial cross-sectional view of an imprint lithography substrate 210 with a masking layer 220 and a conductive layer 230 formed upon substrate 210. Substrate 210 may be composed of a variety of materials including, but not limited to, silicon, silicon dioxide, silicon germanium, gallium nitride, silicon germanium carbon, sapphire, gallium arsenide, epitaxial silicon, polysilicon, glass, quartz, indium tin oxide, SiOx (where x is less than 2) or combinations thereof. Quartz may be preferred for use when deep ultraviolet light wavelengths are required for curing a masking layer on a substrate during an imprint lithography process.

Masking layer 220 may be any material that has a different etching rate than the substrate. Additionally masking layer 220 is formed from a material that may be patterned using a pattern generator system. In an embodiment, masking layer 220 is a photoresist material. Photoresist materials are applied to the substrate using a spin-on coating process. After application of masking layer 220, conductive layer 230 is formed overlying the masking layer. Conductive layer 230 is formed from a conductive metal (e.g., aluminum, indium tin oxide, gold, etc.). Conductive layer 230 is formed as a thin layer over masking layer 220. In some embodiments conductive layer 230 may have a thickness of less than about 100 A. The thickness of conductive layer 230 is set to allow the use of electron pattern generators to expose the underlying masking layer 220 through the conductive layer.

Masking layer 220 may be patterned using an electron beam pattern generator. When an electron beam pattern generator is used, conductive layer 230 may remove charge from the masking layer during the patterning process. During an electron beam development process portions of masking layer 220 are contacted with an electron beam through conductive layer 230. Either a positive or negative photoresist material may be used. The use of an electron beam pattern generator allows the formation of sub 100 nm features in the photoresist.

Figure 4B:
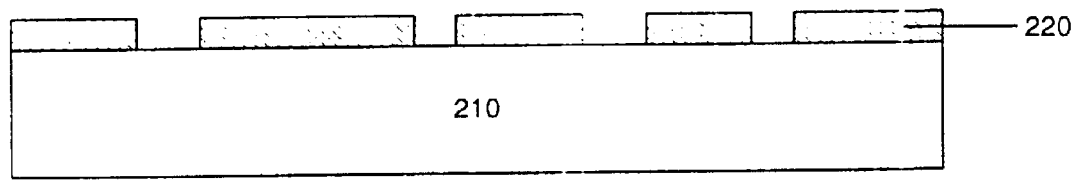

For both positive and negative photoresist the development process is a wet etch process. The removal of portions of the masking layer may be accomplished by removing conductive layer 230 and etching masking layer 220. Alternatively, the material used for conductive layer 230 may be chosen to allow removal of the conductive layer and portions of masking layer 220 using the same etching process. For example, masking layer 220 may be formed from a photoresist material that is etched using an alkaline solution. Conductive layer may be formed using a metal (e.g., aluminum) that is removed using an alkaline solution. Subjecting the substrate to an alkaline solution will remove the conductive layer and portions of the masking layer. FIG. 4B depicts a cross section view of the process after removal of conductive layer 230 and development of masking layer 220.

Figure 4C:
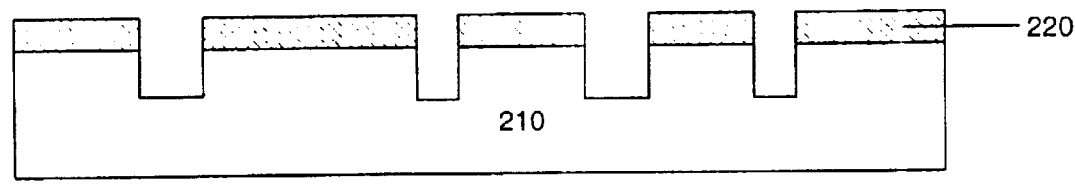
Figure 4D:
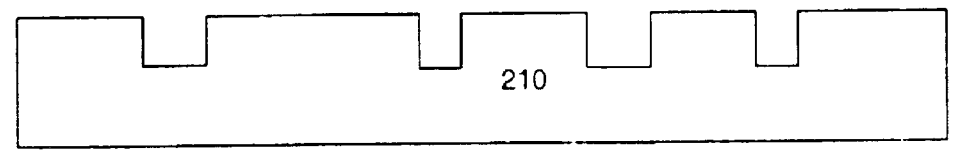

Patterned masking layer 220 may be used to control etching of substrate 210. Etching of substrate 210 may be performed using an anisotropic etch (e.g., a plasma etching process or a reactive ion etching process). Masking layer 220 inhibits etching of the underlying portions of substrate 210. Etching of the exposed portions of substrate 210 is continued until a predetermined depth is reached, as depicted in FIG. 4C. Prior to use of the imprint lithography template, masking layer °is removed from the substrate, as depicted in FIG. 4D. Removal of masking layer 220 may be accomplished by use of isotropic etching (e.g., wet etching process) or anisotropic (e.g., dry etching processes).

Figure 5A:
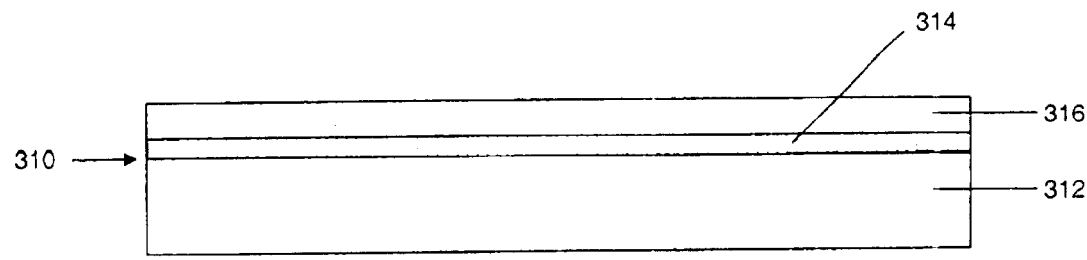
FIGS. 5A–5D depict partial cross-sectional views of a sequence of processing steps for forming an imprint lithography template using a conductive polysilicon layer during etching of a substrate that includes an etch stop layer.

In another embodiment, an etch stop layer may be used to control etching of the substrate. FIG. 5A depicts a partial cross sectional view of a substrate 310 that includes an etch stop layer. Substrate 310 is composed of a base layer 312, an etch stop layer 314, and an upper layer 316. Base layer 312 and upper layer 316 may be composed of the same or different materials. Etch stop layer 314 is composed of a material that has a different etching rate than the material used for upper layer 316. Base layer 312, etch stop layer 314, and upper layer 316 may be composed of a variety of materials including, but not limited to, silicon, silicon dioxide, silicon germanium, gallium nitride, silicon germanium carbon, sapphire, gallium arsenide, epitaxial silicon, polysilicon, glass, quartz, indium tin oxide, SiOx (where x is less than 2) or combinations thereof. Quartz may be preferred as the material for the base and upper layers for use when ultraviolet light wavelengths are required for curing a masking layer on a substrate during an imprint lithography process. Etch stop layer is also formed from an ultraviolet light transmissive material. In one embodiment, the base and upper layers are composed of quartz and the etch stop layer is formed of indium tin oxide. Substrate 310 is formed by sequentially depositing etch stop layer 314 and upper layer 316 on base layer 312 using standard techniques.

Figure 5B:
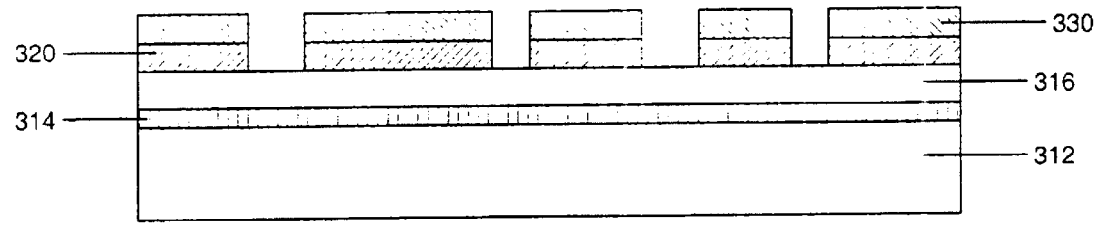
Figure 5C:
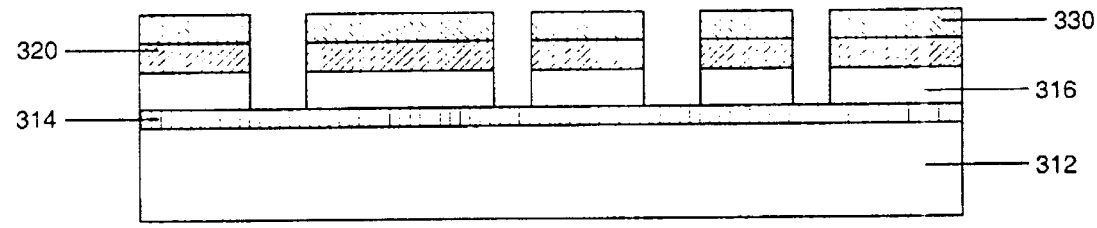
Figure 5D:
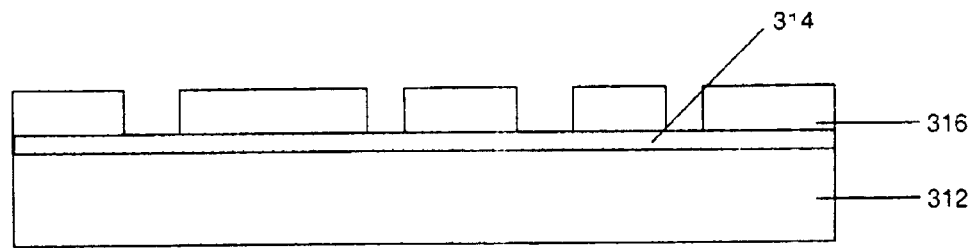

Substrate 310 may be patterned to form a template using any of the methods described herein. FIGS. 5B–5D depict a processing scheme using a conductive polysilicon layer 320 as described above. As described above, a conductive polysilicon layer 320 and a masking layer 330 are deposited upon upper layer 316. Masking layer 330 may be patterned using any of a number of standard techniques. To produce features having a feature size below about 100 nm masking layer 330 is developed using an electron beam pattern generator. After exposure to a pattern generator, masking layer 330 is subjected to a wet etch to produce a patterned masking layer. The patterned masking layer 330 is used to create a patterned conductive polysilicon layer 320 by etching the conductive polysilicon layer as described above. (See FIG. 5B). Together the stack of conductive polysilicon and masking layer allow selective etching of upper layer 316.

As described above, etching of the exposed portions of upper layer 316 may be accomplished using known techniques. Etching of upper layer 316 is continued until the etch stop layer 314 is reached, as depicted in FIG. 5C. In an embodiment, the etching conditions are chosen such that the etch rate of the material that composes upper layer 316 is substantially faster than the etch rate of etch stop layer 314. In this manner, the etch stop layer serves as an indicator of when the proper depth is reached during an etch process. This may be particularly useful when features formed on the template have a variety of sizes. Generally features having a large surface area on the template will etch at a faster rate than features having a small surface area. This may lead to overetching of the larger features due to the inherent differential etch rates. By using etch stop layer this over etching of the upper layer may be avoided. This may be particularly important for the production of templates for imprint lithography. For an imprint lithography template, the depth of the etch portions of the template may determine the height of the features produced in the substrate. Accurate control of the height of the features on a substrate may be important to achieve proper patterning of the substrate.

In one embodiment, upper layer 316 is composed of quartz and etch stop layer 314 is composed of indium tin oxide. The use of such a combination allows easy selection of etching conditions that allow differential etching of the layers. Additionally both quartz and indium tin oxide are ultraviolet light transmissive materials.

As described above, conductive polysilicon layer 320 may be used to inspect the pattern prior to or after etching of the upper layer. After etching of upper layer 316 is completed, conductive polysilicon layer 320 and masking layer 330 are removed. The completed template is depicted in FIG. 5D.

Alternatively, etching of a substrate that includes an etch stop layer may be accomplished using a conductive layer and a masking layer as described earlier with reference to FIGS. 4A–4E. A sequence of etching a substrate that includes an etch stop layer using a conductive layer disposed on a masking layer is depicted in FIGS. 6A–6D.

Figure 6A:
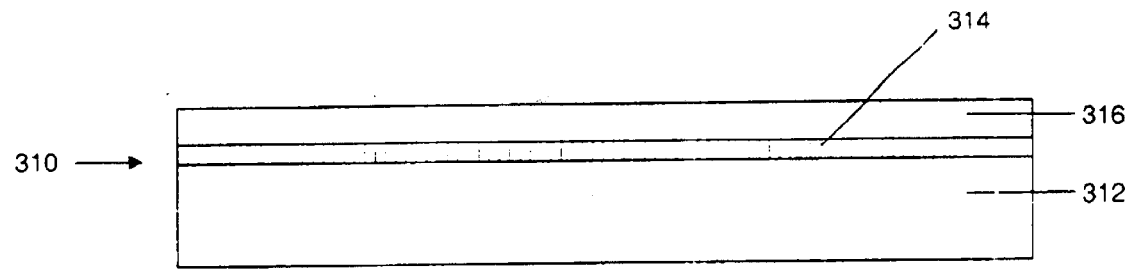
FIGS. 6A–6D depict partial cross-sectional views of a sequence of processing steps for forming an imprint lithography template using a conductive metal layer during etching of a masking layer on a substrate that includes an etch stop layer.
Figure 6B:
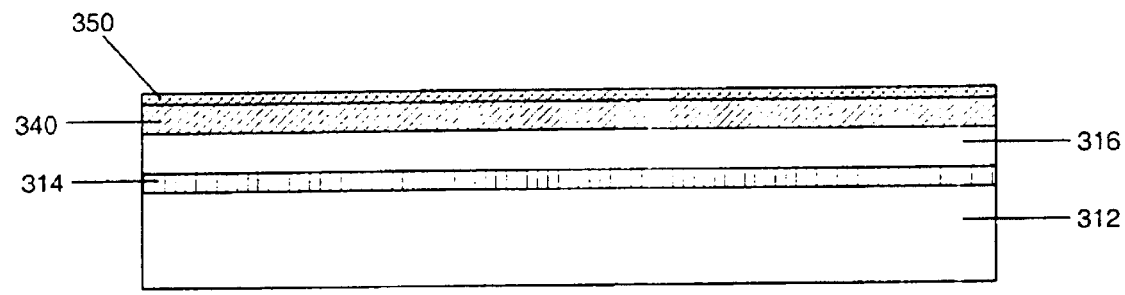

FIG. 6A depicts a partial cross sectional view of a substrate that includes an etch stop layer. Substrate 310 is composed of a base layer 312, an etch stop layer 314, and an upper layer 316. Base layer 312 and upper layer 316 may be composed of the same or different materials, as has been described above. In one embodiment, the base and upper layers are composed of quartz and the etch stop layer is formed of indium tin oxide.

Figure 6C:
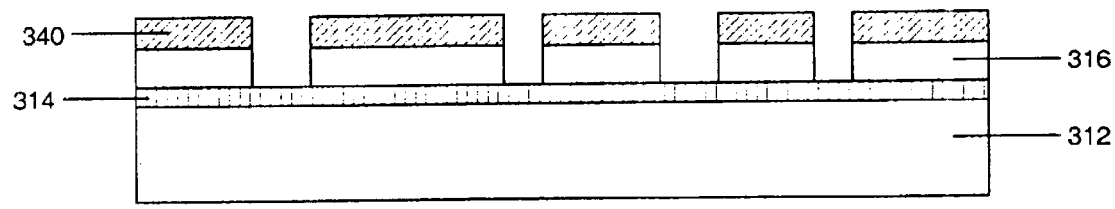

As described above, a masking layer 340 and a conductive layer 35C are deposited upon upper layer 316 of a substrate that includes an etch stop layer 314. (See FIG. 6B) Masking layer 340 may be developed through conductive layer 350 using an electron beam pattern generator. After development, masking layer 340 is subjected to a wet etch to produce a patterned masking layer. The patterned masking layer 340 is used to create control selective etching of the upper layer 316 as depicted in FIG. 6C. Etching of the substrate is continued until the etch stop layer is reached. As described above, the etching conditions are chosen such that the etch rate of the material that composes upper layer 316 is substantially faster than the etch rate of the etch stop layer. In this manner, the etch stop serves as an indicator of when the proper depth is reached during an etch process.

Figure 6D:
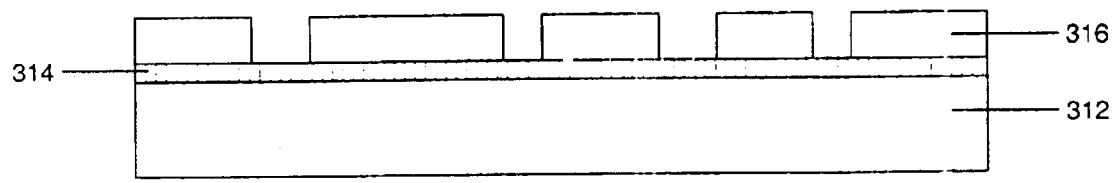

In one embodiment, upper layer 316 is composed of quartz and etch stop layer 314 is composed of indium tin oxide. The use of such a combination allows easy selection of etching conditions that allow differential etching of the layers. Additionally both the quartz and the indium tin oxide are ultraviolet light transmissive materials. After the etching of upper layer 316 is completed, masking layer 340 is removed. The completed template is depicted in FIG. 6D.

It should be understood that a template that includes an etch stop layer may be further patterned to create channels along the perimeter of the template, as has been described previously.

In this patent, certain U.S. patents, U.S. patent applications, and other materials (e.g., articles) have been incorporated by reference. The text of such U.S. patents, U.S. patent applications, anal other materials is, however, only incorporated by reference to the extent that no conflict exists between such text and the other statements and drawings set forth herein. In the event of such conflict, then any such conflicting text in such incorporated by reference U.S. patents, U.S. patent applications, and other materials is specifically not incorporated by reference in this patent.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method of forming a lithography template, the method comprising:

forming a conductive polysilicon layer upon a substrate, wherein the substrate is composed of a light transmissive material;

forming a masking layer upon the conductive polysilicon layer;

forming a pattern in the masking layer such that a portion of the conductive polysilicon layer is exposed through the masking layer;

etching one or more of the exposed portions of the conductive polysilicon layer such that a portion of the substrate is exposed through the conductive polysilicon layer; and etching one or more of the exposed portions of the substrate.

2. The method of claim 1, further comprising removing the masking layer and the conductive polysilicon layer, providing the substrate formed from a material selected from a set of materials consisting essentially of glass, quartz glass and fused silica, with said conductive polysilicon layer being n-doped polysilicon.

3. The method of claim 1 wherein the conductive polysilicon layer has a conductivity sufficient to remove a portion of a charge from the substrate during patterning of the masking layer with an electron beam pattern generator.

4. The method of claim 1, wherein the masking layer is a photoresist material, and wherein forming the pattern in the masking layer comprises:
   coating the conductive polysilicon layer with the photoresist material;
   exposing one or more portions of the photoresist material to an electron beam with an electron beam pattern generator; and
   removing one or more of the exposed portions of the photoresist material.

5. The method of claim 1, wherein the masking layer is a photoresist material, and wherein forming the pattern in the masking layer comprises:
   coating the conductive polysilicon layer with the photoresist material;
   exposing one or more portions of the photoresist material to light with a laser pattern generator; and
   removing one or more of the exposed portions of the photoresist material.

6. The method of claim 1 wherein the masking layer is a photoresist material, and wherein forming the pattern in the masking layer comprises:
   coating the conductive polysilicon layer with the photoresist material;
   exposing one or more portions of the photoresist material to an electron beam with an electron beam pattern generator; and
   removing one or more of the unexposed portions of the photoresist material.

7. The method of claim 1 wherein the masking layer is a photoresist material, and wherein forming the pattern in the masking layer comprises:
   coating the conductive polysilicon layer with the photoresist material;
   exposing one or more portions of the photoresist material to light with a laser pattern generator; and
   removing one or more of the unexposed portions of the photoresist material.

8. The method of forming a lithography template, the method comprising:
   providing a substrate, the substrate comprising a base layer, an etch stop layer disposed upon the base layer, and an upper layer disposed above the etch stop layer, wherein the base layer, the etch stop layer, and the upper layer are composed of a light transmissive material;
   forming a conductive polysilicon layer upon the upper layer;
   forming a masking layer upon the conductive polysilicon layer;
   forming a pattern in the masking layer such that a portion of the conductive polysilicon layer is exposed through the masking layer;
   etching one or more of the exposed portions of the conductive polysilicon layer such that a portion of the substrate is exposed through the polysilicon layer; and
   etching one or more of the exposed portions of the substrate until the etch stop ayer is reached.

9. The method of claim 8 wherein providing said substrate further includes providing the substrate formed from a material selected from a set of materials consisting essentially of glass, quartz glass and fused silica, forming said etch stop layer from indium tin oxide, and forming said upper layer from materials selected from a set consisting essentially of deposited silicon dioxide and grown quartz and said forming said conductive polysilicon layer further including forming said conductive polysilicon layer from n-doped polysilicon.

10. The method of claim 8 wherein the conductive polysilicon layer has a conductivity sufficient to remove a portion of a charge from the substrate during etching of the masking layer with an electron beam pattern generator.

11. The method of claim 8 wherein the masking layer is a photoresist material, and wherein forming the pattern in the masking layer comprises:
   coating the conductive polysilicon layer with the photoresist material;
   exposing one or more portions of the photoresist material to an electron beam with an electron beam pattern generator; and
   removing one or more of the exposed portions of the photoresist material.

12. The method of claim 8 wherein the masking layer is a photoresist material, and wherein forming the pattern in the masking layer comprises:
   coating the conductive polysilicon layer with the photoresist material;
   exposing one or more portions of the photoresist material to light with a laser pattern generator; and
   removing one or more of the exposed portions of the photoresist material.

13. The method of claim 8 wherein the masking layer is a photoresist material, and wherein forming the pattern in the masking layer comprises:
   coating the conductive polysilicon layer with the photoresist material;
   exposing one or more portions of the photoresist material to an electron beam with an electron beam pattern generator; and
   removing one or more of the unexposed portions of the photoresist material.

14. The method of claim 8 wherein the masking layer is a photoresist material, and wherein forming the pattern in the masking layer comprises:
   coating the conductive polysilicon layer with the photoresist material;
   exposing one or more portions of the photoresist material to light with a laser pattern generator; and
   removing one or more of the unexposed portions of the photoresist material.

15. The method of claim 8 wherein the depth of the pattern etched in the substrate is selected for a desired aspect ratio in the template and wherein inspecting the pattern formed on the conductive polysilicon layer comprises exposing the conductive polysilicon layer to an inspection light, wherein a thickness of the conductive polysilicon layer and the wavelength of the inspection light are predetermined to enhance a contrast between the patterned conductive polysilicon layer and the exposed portions of the substrate.

16. The method of claim 8 wherein said conductive polysilicon layer has a thickness that is about ½ of a wavelength of an inspection light.

17. A method of patterning a lithographic template, said method comprising:
 forming, on said lithographic template, a layer of conductive polysilicon material that is transparent to visible light;
 applying, on said layer of conductive polysilicon material, a masking layer;
 creating a pattern in said masking layer to expose a sub-portion of said layer of conductive polysilicon material; and
 transferring said pattern into said template.

18. The method as recited in claim 17 wherein said polysilicon material is selected from a set consisting of titanium silicide, tungsten silicide and cobalt silicide.

19. The method as recited in claim 17 wherein forming further includes depositing said layer of conductive polysilicon material employing chemical vapor deposition techniques.

20. The method as recited in claim 17 wherein forming further includes implanting ions into said layer of conductive polysilicon layer.

21. The method as recited in claim 20 wherein said ions are selected from a set of ions consisting of phosphorous, boron and arsenic.

22. The method as recited in claim 20 further includes annealing said layer of conductive polysilicon material.

* * * * *